US010128310B2

(12) United States Patent
    Sugiura

(10) Patent No.: US 10,128,310 B2
(45) Date of Patent: Nov. 13, 2018

(54) MAGNETORESISTIVE MEMORY DEVICE AND MANUFACTURING METHOD OF THE SAME

(71) Applicant: Toshiba Memory Corporation, Minato-ku, Tokyo (JP)

(72) Inventor: Kuniaki Sugiura, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 188 days.

(21) Appl. No.: 15/261,798

(22) Filed: Sep. 9, 2016

(65) Prior Publication Data

US 2017/0263677 A1    Sep. 14, 2017

Related U.S. Application Data

(60) Provisional application No. 62/308,139, filed on Mar. 14, 2016.

(51) Int. Cl.

| | | |
|---|---|---|
| *H01L 27/22* | (2006.01) | |
| *H01L 43/02* | (2006.01) | |
| *H01L 43/08* | (2006.01) | |
| *G11C 11/16* | (2006.01) | |
| *H01L 43/10* | (2006.01) | |
| *H01L 43/12* | (2006.01) | |

(52) U.S. Cl.
    CPC ......... *H01L 27/228* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
    CPC ....... H01L 27/228; H01L 43/08; H01L 27/22; H01L 43/02; H01L 43/10; G11C 11/161; G11C 11/15
    See application file for complete search history.

(56) References Cited

U.S. PATENT DOCUMENTS

| | | | |
|---|---|---|---|
| 6,281,099 B1 | 8/2001 | Yoshida | |
| 7,102,921 B2 * | 9/2006 | Anthony | G11C 11/1675 365/158 |
| 8,043,732 B2 | 10/2011 | Anderson et al. | |
| 8,513,751 B2 | 8/2013 | Asao | |
| 9,778,039 B2 * | 10/2017 | Najafi | G01P 15/0802 |
| 2001/0040819 A1 * | 11/2001 | Hayashi | B82Y 10/00 365/158 |
| 2011/0097617 A1 * | 4/2011 | Gu | H01M 2/1077 429/120 |
| 2012/0243308 A1 * | 9/2012 | Saida | G11C 11/161 365/173 |

(Continued)

FOREIGN PATENT DOCUMENTS

JP    2013143548 A    7/2013

*Primary Examiner* — Syed Gheyas
*Assistant Examiner* — S. M. S Imtiaz
(74) *Attorney, Agent, or Firm* — Holtz, Holtz & Volek PC

(57) ABSTRACT

According to one embodiment, a magnetoresistive memory device includes a magnetoresistive element of a stacked layer structure includes a first magnetic layer, a second magnetic layer, and a nonmagnetic layer between the first and second magnetic layers, and an insulating layer of a group III-V compound provided on a side of the first magnetic layer of the magnetoresistive element, the insulating layer including an chemical element of group II, group IV, or group VI.

9 Claims, 11 Drawing Sheets

(56) References Cited

U.S. PATENT DOCUMENTS

| | | | |
|---|---|---|---|
| 2012/0244639 A1* | 9/2012 | Ohsawa | H01L 43/12 |
| | | | 438/3 |
| 2014/0284534 A1* | 9/2014 | Nagase | H01L 43/12 |
| | | | 257/1 |
| 2014/0284738 A1 | 9/2014 | Nakazawa et al. | |
| 2016/0104834 A1* | 4/2016 | Toko | H01L 43/12 |
| | | | 257/421 |

* cited by examiner

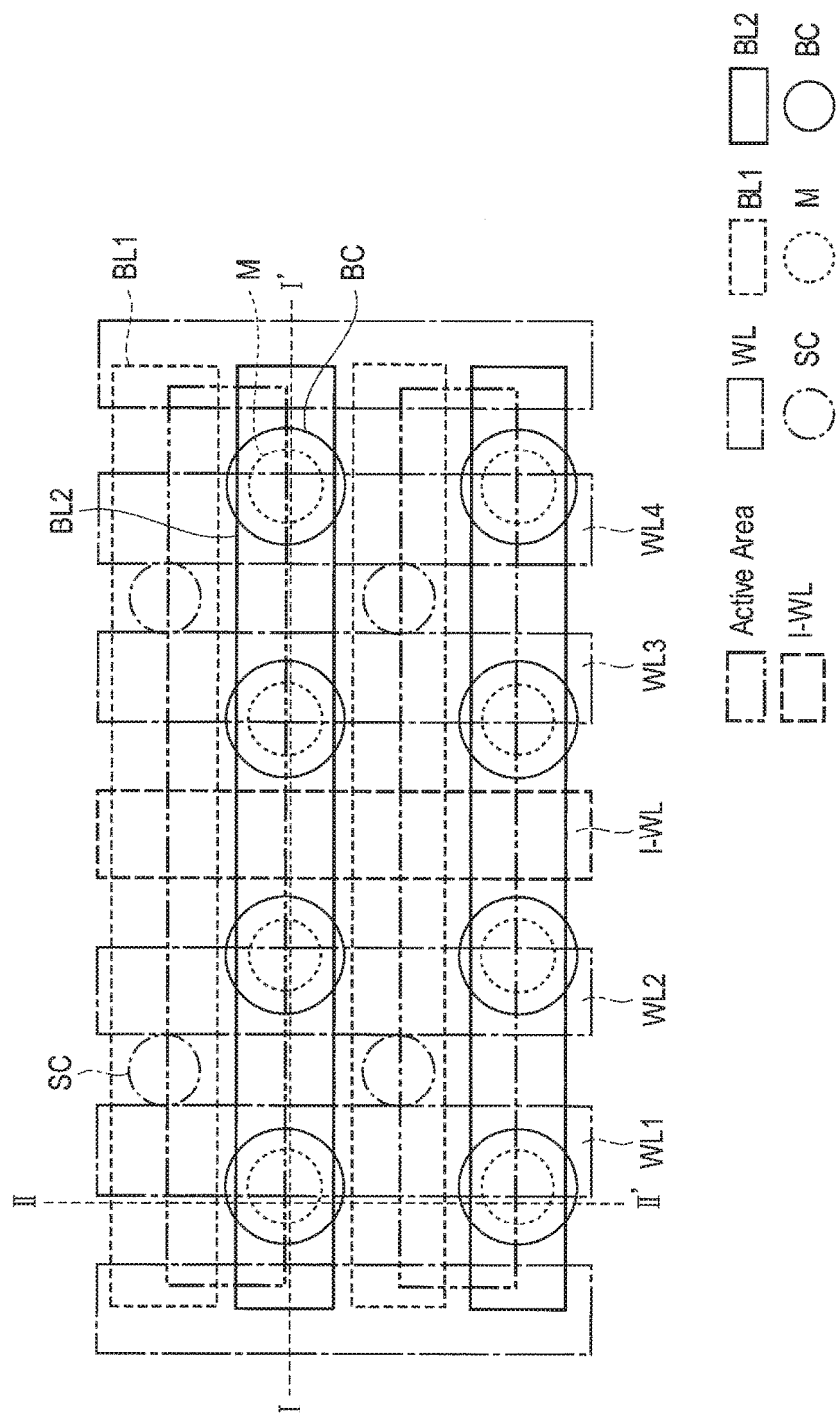
F I G. 1

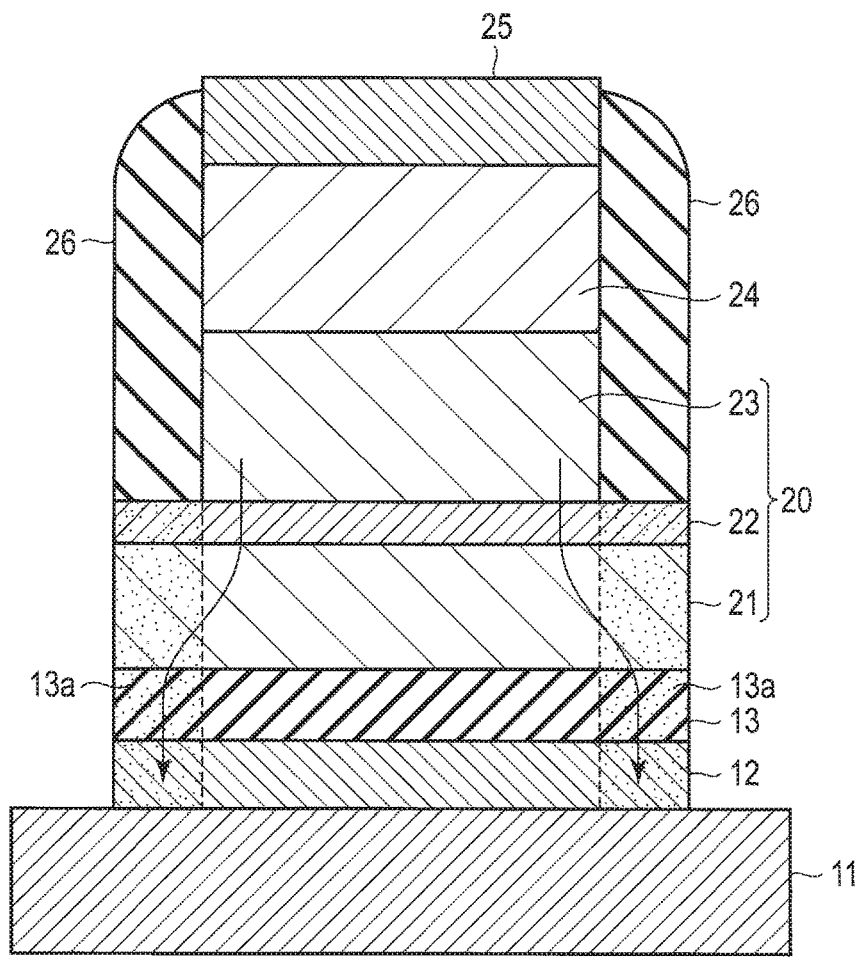
F I G. 7

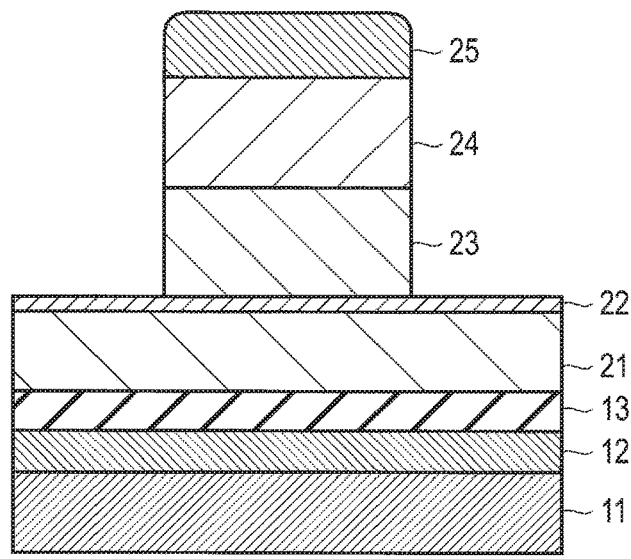
F I G. 8A
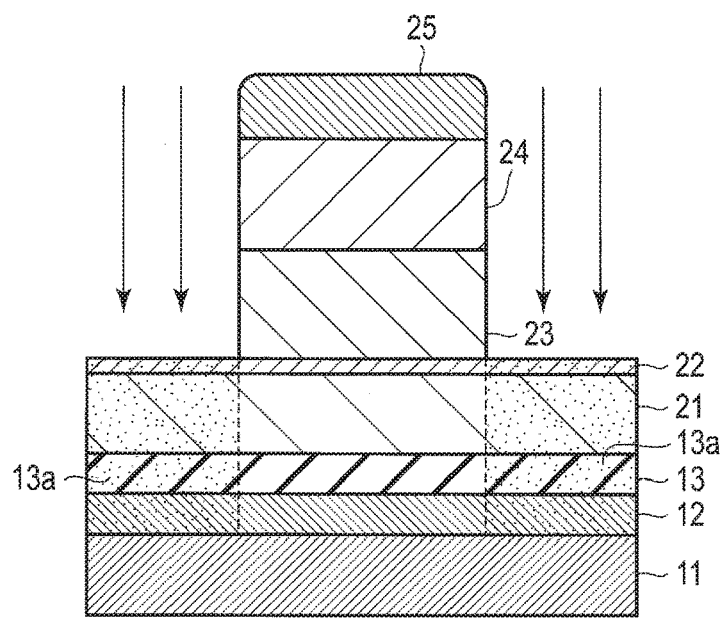
F I G. 8B

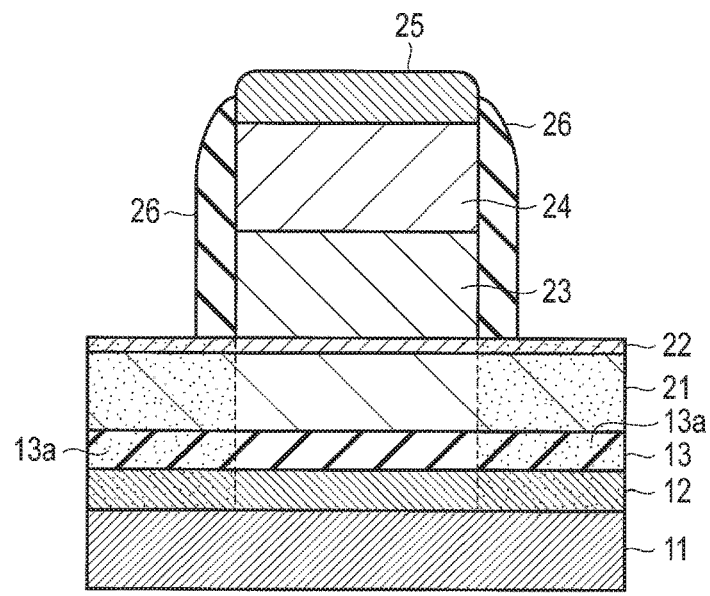
F I G. 8C
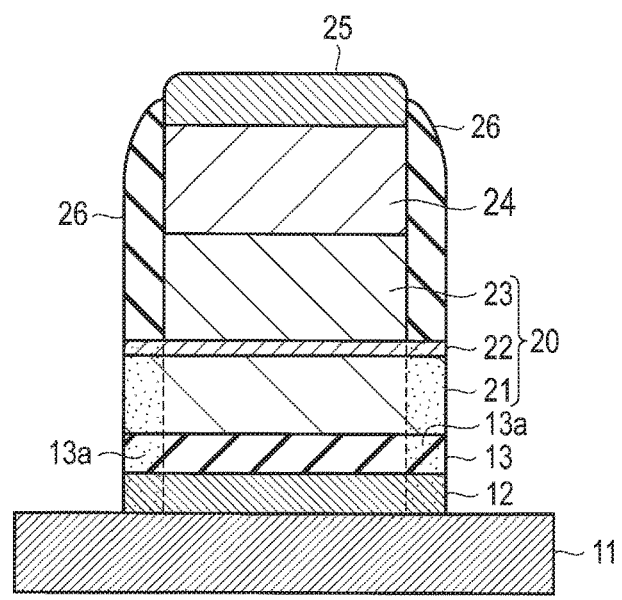
F I G. 8D

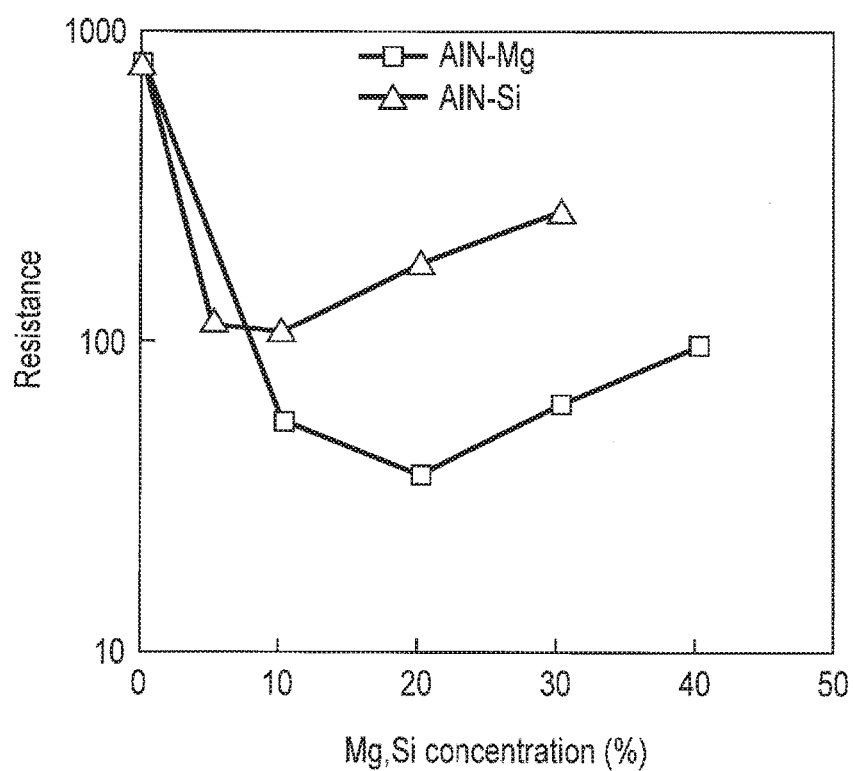
F I G. 11

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/308,139, filed Mar. 14, 2016, the entire contents of which are incorporated herein by reference.

FIELD

Embodiments described herein relate generally to a magnetoresistive memory device and a manufacturing method of the same.

BACKGROUND

Recently, there are expectations and attention on a large-capacity magnetoresistive random access memory (MRAM) in which a magnetic tunnel junction (MTJ) element is used. The MTJ element comprises two magnetic layers across an intervening tunnel barrier layer. One of the magnetic layers is a magnetization fixed layer (reference layer) in which the magnetization direction is fixed such that it does not change. The other one is a magnetization free layer (storage layer) in which the magnetization direction is easily reversed.

BRIEF DESCRIPTION OF THE DRAWINGS

FIG. 1 is a plan view which schematically illustrates a magnetoresistive memory device according to a first embodiment.

FIG. 7 is a cross-sectional view showing a structure of a memory cell portion of a magnetoresistive memory device according to a third embodiment.

FIGS. 8A to 8D are cross-sectional views showing a manufacturing process of the memory cell portion shown in FIG. 7.

FIG. 11 is a characteristic diagram showing the relationship between addition amount of impurity (amount of doping) and a resistance.

DETAILED DESCRIPTION

In general, according to one embodiment, a magnetoresistive memory device comprises a magnetoresistive element of a stacked layer structure comprising a first magnetic layer, a second magnetic layer, and a nonmagnetic layer between the first and second magnetic layers; and an insulating layer of a group III-V compound provided on a side of the first magnetic layer of the magnetoresistive element, the insulating layer including an chemical element of group II, group IV, or group VI.

Hereinafter, a magnetoresistive memory device of the present embodiment will be described with reference to the drawings.

(First Embodiment)

Figure 2:
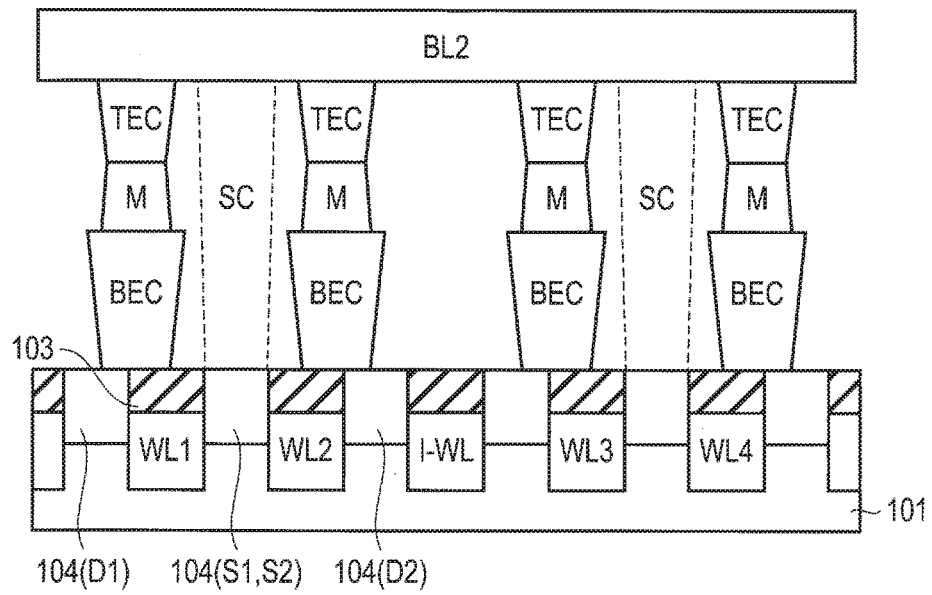
FIG. 2 is a cross-sectional view taken along line I-I' of FIG. 1.
Figure 3:
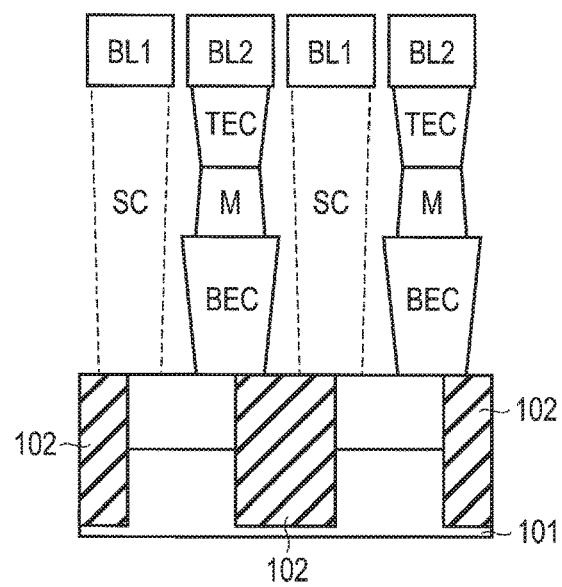
FIG. 3 is a cross-sectional view taken along line II-II' of FIG. 1.

FIG. 1 is a plan view which schematically illustrates a magnetoresistive memory device according to a first embodiment. FIG. 2 is a cross-sectional view taken along line I-I' of FIG. 1, and FIG. 3 is a cross-sectional view taken along line II-II' of FIG. 1. A member indicated by a broken line in FIGS. 2 and 3 represents a plug SC at the back side which cannot be seen in the I-I' and II-II' cross-sections.

The magnetoresistive memory device of the present embodiment is an MRAM comprising an MTJ element (a magnetoresistive element) of a spin-transfer-torque writing method as a storage element. A perpendicular magnetization film is used in the above MTJ element. The perpendicular magnetization film is a magnetization film in which the direction of magnetization (direction of axis of easy magnetization) is substantially perpendicular to the film plane of the perpendicular magnetization film.

In the drawings, 101 indicates a silicon substrate (a semiconductor substrate), and an element isolation region 102 is formed on a surface of the silicon substrate 101. The element isolation region 102 defines an active region.

The MRAM of the present embodiment comprises a first select transistor in which a gate electrode is word line WL1, a first MTJ element M which is connected to source/drain region 104 (drain region D1) on one side of the first select transistor, a second select transistor in which a gate electrode is word line WL2, and a second MTJ element M which is connected to source/drain region 104 (drain region D2) on one side of the second select transistor. In the drawing, 103 indicates a protective insulating film. That is, a memory cell of the present embodiment is constituted of an MTJ (a storage element) and a select transistor, and two select transistors of the adjacent two memory cells share source/drain region 104 (source regions S1, S2), which is the source/drain region on the other side.

A gate (a gate insulating film and a gate electrode) of the select transistor of the present embodiment is buried in a surface of the silicon substrate 101. That is, the gate of the present embodiment has a buried gate (BG) structure. Similarly, a gate (word line I-WL) for element isolation has the BG structure.

Source/drain region 104 (D1) on one side of the first select transistor is connected to the lower part of the first MTJ element M via a bottom electrode BEC. The upper part of the first MTJ element M is connected to a bit line BL2 via a top electrode TEC. Source/drain region 104 (S1) on the other side of the first select transistor is connected to bit line BL1 via the plug SC.

In the present embodiment, while a planar pattern of each of the bottom electrode BEC, the MTJ element M, the top electrode TEC, and the plug SC is circular, they may be formed in another shape.

Source/drain region 104 (D2) on one side of the second select transistor is connected to the lower part of the second MTJ element M via a bottom electrode BEC. The upper part of the second MTJ element M is connected to bit line BL2 via a top electrode TEC. Source/drain region 104 (S2) on the other side of the second select transistor is connected to bit line BL1 via the plug SC.

The first select transistor, the first MTJ element M, the second select transistor, and the second MTJ element M (i.e., two memory cells) are provided in every active region. The two adjacent active regions are separated from each other by the element isolation region 102.

Word lines WL3 and WL4 correspond to word lines WL1 and WL2, respectively. Accordingly, two memory cells are constituted by a first select transistor in which word line WL3 is a gate, a first MTJ element M which is connected to a source/drain region on one side of the first select transistor, a second select transistor in which word line WL4 is a gate, and a second MTJ element N which is connected to a source/drain region on one side of the second select transistor.

Note that the layout of the MTJ element, BL, WL, etc., is in no way limited to the illustration of FIGS. 1 to 3. For example, as disclosed in Patent Document 1 (US 2014/0284738 A1), BL2 may be arranged at a lower layer than BL1. Further, as disclosed in Patent Document 2 (U.S. Pat. No. 8,513,751 B2), an active region may be inclined with respect to a gate electrode.

Figure 4:
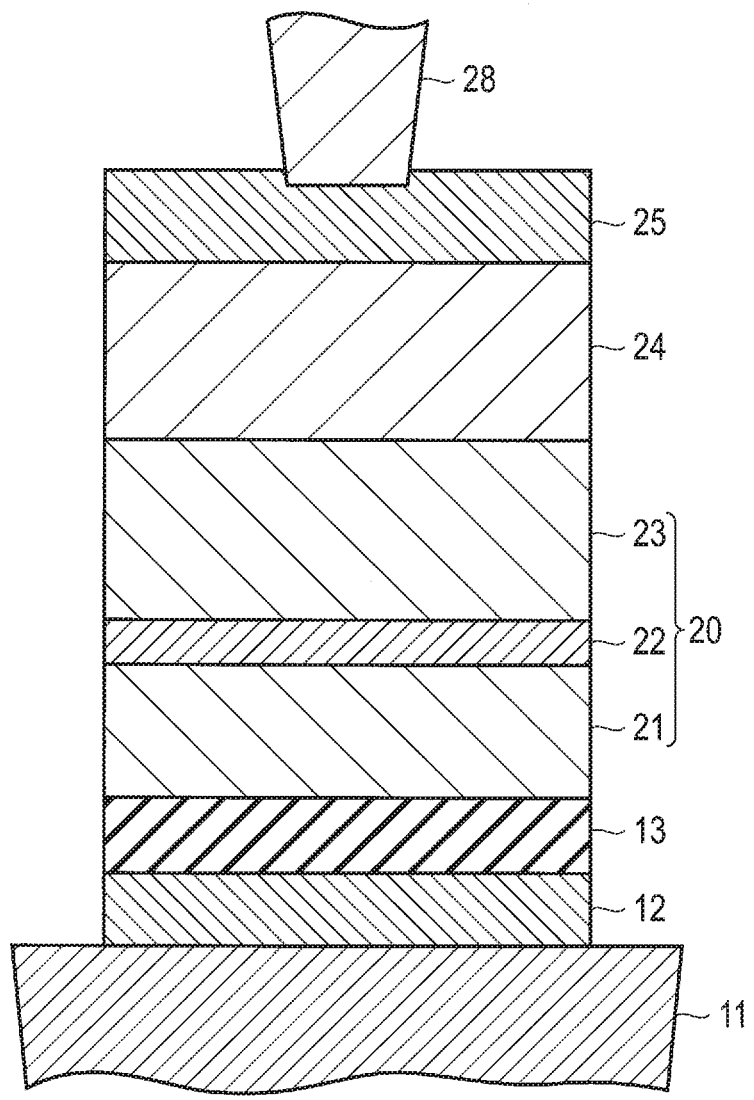
FIG. 4 is a cross-sectional view showing a structure of a memory cell portion of the magnetoresistive memory device of the first embodiment.

FIG. 4 is a cross-sectional view showing a specific structure of an MTJ element portion employed in the present embodiment.

A conductive buffer layer 12 is formed on the bottom electrode (BEC) 11. Further, an underlayer (UL [insulating layer]) 13 is formed on the buffer layer 12.

It is sufficient if the buffer layer 12 is one which can improve the crystallinity of the underlayer 13. For example, a material of the buffer layer 12 includes Al, Be, Mg, Ca, Sr, Ba, Sc, Y, La, Si, Zr, Hf, W, Cr, Mo, Nb, Ti, Ta, V, etc. Also, a boride of the above elements may be included. The boride is not limited to a binary compound made of two kinds of elements, and may be a ternary compound made of three kinds of elements. That is, the boride may be a mixture of a binary compound. For instance, examples of such a boride may be HfB, MgAlB, HfAlB, ScAlB, ScHfB, and HfMgB. Further, the aforementioned materials may be stacked.

As high-melting-point metals and a boride of those metals are used, it is possible to suppress diffusion of a buffer layer material into a magnetic layer, and prevent deterioration of the MR ratio. Here, a high-melting-point metal is a material having a higher melting point than Fe or Co, and is, for example, Zr, Hf, W, Cr, Mo, Nb, Ti, Ta, and V.

The underlayer 13 is to improve the magnetocrystalline anisotropy of a layer to be formed thereon, and a material having a small mass can be used. As the underlayer 13, GaN, AlN, InN, MgO, SiN etc., can be used.

Here, in the present embodiment, an impurity such as Si is doped into the underlayer 13, thereby reducing the resistance of the underlayer 13. By doping Si into the underlayer 13 (for example, 5 at %), the resistance of the underlayer 13 is reduced as shown in FIG. 11 described later.

For example, in order to form an underlayer 13 in which Si is doped into GaN, in an atmosphere of Ar and N, the underlayer 13 may be formed by sputtering using a Ga target and an Si target. Alternatively, the underlayer 13 may be formed by sputtering using a GaN target and an Si target in an Ar atmosphere.

A storage layer (SL [first magnetic layer]) 21 is formed on the underlayer 13. On the storage layer 21, a tunnel barrier layer (nonmagnetic layer) 22, and a reference layer (RL [second magnetic layer]) 23 are formed. In this way, an MTJ element 20 having a stacked layer structure in which the tunnel barrier layer 22 is sandwiched between the storage layer 21 and the reference layer 23 is composed.

Here, the storage layer 21 has magnetic anisotropy perpendicular to a film surface, the magnetization direction in the storage layer 21 is variable, and the storage layer 21 is formed of CoFeB or FeB, for example. The tunnel barrier layer 22 is for passing a tunneling current, and is formed of MgO, for example. Further, the reference layer 23 has magnetic anisotropy perpendicular to a film surface, the magnetization direction in the reference layer 23 is fixed, and the reference layer 23 is formed of CoFeB, CoB, CoPt, CoNi, or CoPd, for example. The magnetic layers which constitute the storage layer 21 and the reference layer 23 are not limited to the above-described materials, and the other ferromagnetic materials can also be used. On the reference layer 23 of the MTJ element 20, a shift canceling layer (SCL [third magnetic layer]) 24 is formed. A cap layer (Cap) 25 is formed on the shift canceling layer 24. Further, a top electrode (TEC) 28 is connected to the cap layer 25.

Here, the shift canceling layer 24 is for eliminating or reducing an influence of a stray magnetic field from the reference layer 23, and has the magnetization direction which is opposite to that of the reference layer 23. For the shift canceling layer 24, a ferromagnetic material similar to the reference layer 23 or a superlattice in which Co and Pt are alternately stacked can be used. It suffices that the cap layer 25 is a conductive metal material, and for example, Ta, W, Ru, and Pt may be used.

As can be seen, in the present embodiment, by doping an impurity such as Si into the underlayer 13, the resistance of the underlayer 13 can be reduced.

Using an underlayer (an insulating layer) for the base of the storage layer (SL) of the MTJ element is effective in reducing a write current Ic and increasing thermal stability $\Delta E$. In particular, a sufficiently crystallized underlayer is effective in improving retentive power Hc of the storage layer and $\Delta E$. However, this type of underlayer has a problem that the resistance is high. Accordingly, when an MTJ element is formed, the series resistance of the element as a whole is increased, causing a decrease in the MR ratio (resistance change ratio=(resistance in antiparallel state−resistance in parallel state)/resistance in parallel state).

In the present embodiment, by doping an impurity into the underlayer 13, the resistance of the underlayer 13 can be reduced, and it is possible to avoid a problem of high series resistance when the underlayer 13 is used.

Therefore, according to the present embodiment, even if an underlayer 13 having a great film thickness is used, it is possible to reduce the series resistance of the element as a whole while obtaining an advantage of reducing the write current Ic and increasing thermal stability $\Delta E$. Consequently, a magnetoresistive memory device having good element characteristics can be realized.

Preferably, the amount of Si to be doped in the underlayer 13 should be 5 to 30% (at %). This is because if the amount of doping is less than 5%, the advantage of reducing the resistance of the underlayer 13 is hardly acknowledged, and if the amount of doping exceeds 30%, roughness of the underlayer 13 is reduced.

(Second Embodiment)

Figure 5:
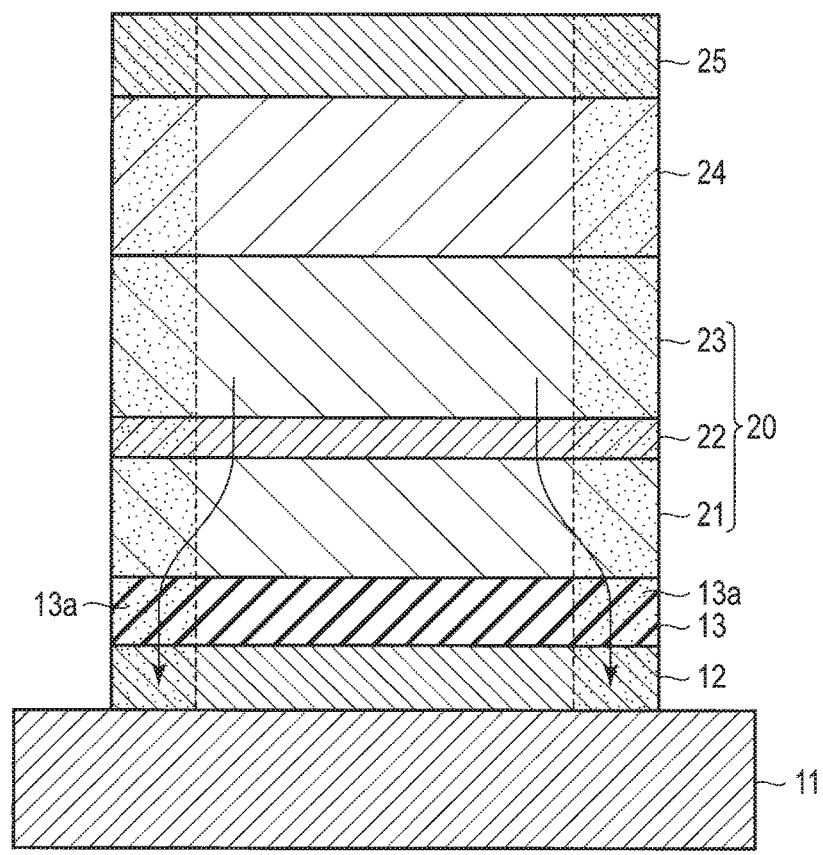
FIG. 5 is a cross-sectional view showing a structure of a memory cell portion of a magnetoresistive memory device according to a second embodiment.

FIG. 5 is a cross-sectional view showing a structure of a memory cell portion of a magnetoresistive memory device according to a second embodiment. It should be noted that the same portions as those of FIG. 4 will be given the same reference numbers, and detailed explanations of them will be omitted.

The point in which the present embodiment is different from the first embodiment described above is the way in which the impurity is doped into the underlayer 13.

As in the first embodiment, on a bottom electrode (BEG) 11, a buffer layer 12, an underlayer (UL) 13, an MTJ element 20, a shift canceling layer (SCL) 24, and a cap layer (Cap) 25 are formed.

In the underlayer 13, an impurity such as Si is doped not in the entirety, but only at an end portion of the underlayer 13. That is, an impurity such as Si is doped into an end portion 13a of the underlayer 13 by ion implantation, thereby the resistance of the end portion 13a of the underlayer 13 is reduced.

Next, a method of manufacturing the magnetoresistive memory device of the present embodiment will be described with reference to FIGS. 6A to 6E.

Figure 6A:
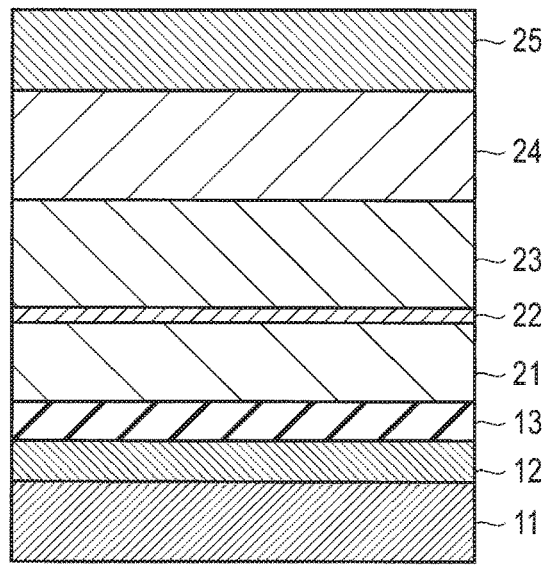
FIGS. 6A to 6D are cross-sectional views showing a manufacturing process of the memory cell portion shown in FIG. 5.

First, as shown in FIG. 6A, on a substrate (not shown) on which the bottom electrode 11 is provided, the conductive buffer layer 12, the insulative underlayer 13, the storage layer 21, the tunnel barrier layer 22, the reference layer 23, the shift canceling layer 24, and the cap layer (a mask material layer) 25 are formed.

Figure 6B:
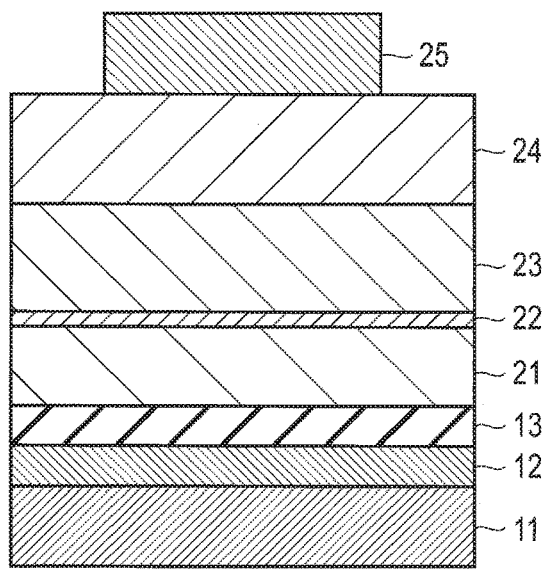

Next, as shown in FIG. 6B, the cap layer 25 is processed into an MTJ element pattern. In this processing, it is sufficient to provide an insulating film of SiN, etc., on the cap layer 25, and selectively etch the cap layer 25 by using this insulating film as a mask.

Figure 6C:
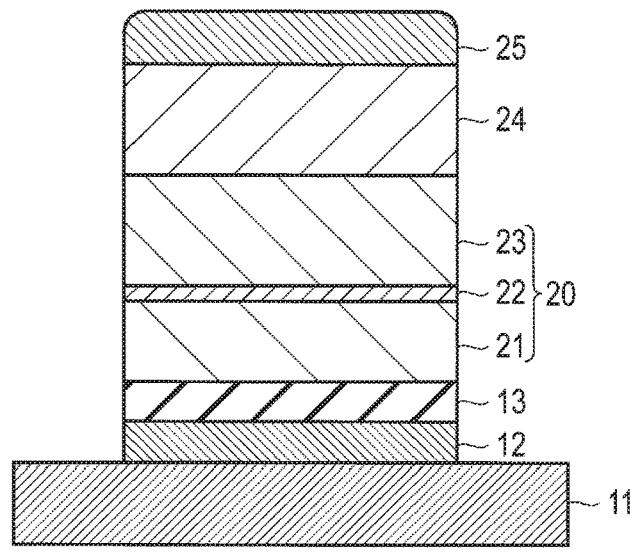

Next, as shown in FIG. 6C, by using the cap layer 25 as a mask, each of layers 24, 23, 22, 21, 13, and 12 is selectively etched by an ion beam etching (IBE) method. In this way, the MTJ element 20 constituted of the storage layer 21, the tunnel barrier layer 22, and the reference layer 23 is formed. Note that the etching method is not necessarily limited to the IBE method, and a reactive ion etching (RIE) method may alternatively be employed.

Figure 6D:
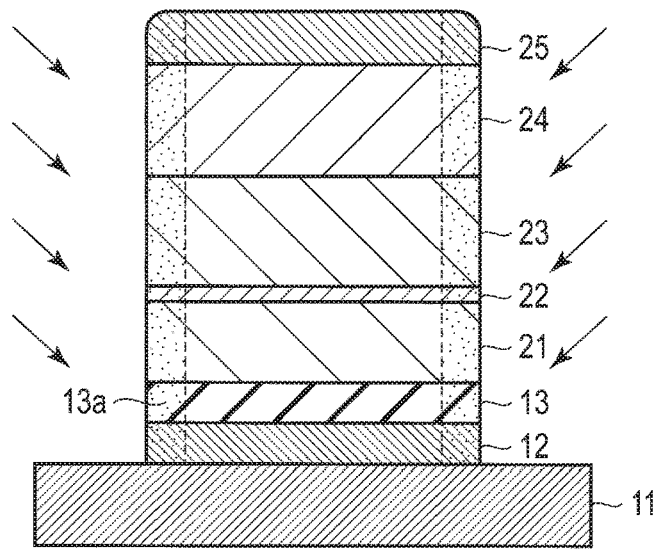

Next, as shown in FIG. 6D, an impurity such as Si is ion implanted from an oblique direction. By this ion implantation, as the impurity is doped into the end portion 13a of the underlayer 13, the resistance of the end portion of the underlayer 13 is reduced. Also, while an end portion of the storage layer 21 is magnetically deactivated, conductivity is sufficiently maintained. Accordingly, as shown by an arrow in FIG. 5, since a current path which passes through the end portion of the underlayer 13 exists, there will not be a problem of the series resistance of the element as a whole increasing.

As can be seen, in the present embodiment, since an impurity is doped into only the end portion of the underlayer 13 by ion implantation, the series resistance of the element as a whole can be reduced. Accordingly, an advantage similar to that of the first embodiment can be obtained. Here, if an impurity is doped into the entire underlayer 13, an advantage of promoting crystallization of a layer to be formed on the underlayer 13 may be reduced. In the present embodiment, by doping an impurity into only a part of the underlayer 13, it becomes possible to prevent the magnetocrystalline anisotropy of a layer to be formed on the underlayer 13 from being affected.

Further, in the present embodiment, by performing ion implantation from an oblique direction, the impurity is not doped into a central portion (a region excluding the end portion) in all of the storage layer 21, the reference layer 23, and the shift canceling layer 24. Consequently, the characteristics of the MTJ element 20 are not degraded by the impurity ion implantation. Meanwhile, while the impurity is doped into the end portions of the respective layers 21 to 24 other than the underlayer 13, this will not present any problem. That is, although each of the end portions of the storage layer 21, the reference layer 23, and the shift canceling layer 24 is demagnetized by the impurity doping, no problem will be raised if the MTJ element 20 is designed in a region excluding the end portion.

(Third Embodiment)

FIG. 7 is a cross-sectional view showing a structure of a memory cell portion of a magnetoresistive memory device according to a third embodiment. It should be noted that the same portions as those of FIG. 4 will be given the same reference numbers, and detailed explanations of them will be omitted.

The point in which the present embodiment is different from the second embodiment described above is that a step is formed at a boundary between a block of an underlayer 13, a storage layer 21, and a tunnel barrier layer 22 and a block of a reference layer 23 and a shift canceling layer 24, and ion implantation is performed in only the portion lower than the tunnel barrier layer 22.

As in the first embodiment, on a bottom electrode (BEC) 11, a buffer layer 12, the underlayer (UL) 13, an MTJ element 20, the shift canceling layer (SCL) 24, and a cap layer (Cap) 25 are formed.

The width or diameter of the reference layer 23, the shift canceling layer 24, and the cap layer 25 on the upper side is less than the width or diameter of the buffer layer 12, the underlayer 13, the storage layer 21, and the tunnel barrier layer 22 on the lower side. Further, on a side portion of the reference layer 23, the shift canceling layer 24, and the cap layer 25, a sidewall insulating film 26 of SiN, etc., is formed.

In the underlayer 13, an impurity such as Si is doped not in the entirety, but only at an end portion of the underlayer 13, as in the second embodiment. That is, an impurity such as Si is doped into an end portion 13a of the underlayer 13 by ion implantation, thereby the resistance of the end portion 13a of the underlayer 13 is reduced.

Next, a method of manufacturing the magnetoresistive memory device of the present embodiment will be described with reference to FIGS. 8A to 8E.

First, as in FIGS. 6A and 6B, on a substrate (not shown) on which the bottom electrode 11 is provided, the buffer layer 12, the insulative underlayer 13, the storage layer 21, the tunnel barrier layer 22, the reference layer 23, the shift canceling layer 24, and the cap layer (a mask material layer) 25 are formed. Further, the cap layer 25 is processed into an MTJ element pattern.

Next, as shown in FIG. 8A, by using the cap layer 25 as a mask, the shift canceling layer 24 and the reference layer 23 are selectively etched by an IBE method, etc. Note that the etching method is not necessarily limited to the IBE method, and an RIE method may alternatively be employed.

Next, as shown in FIG. 8B, an impurity such as Si is ion implanted. In this way, an impurity is doped into end portions of the underlayer 13, the storage layer 21, and the tunnel barrier layer 22. More specifically, the impurity is ion implanted into the underlayer 13 through the tunnel barrier layer 22 and the storage layer 21. In this way, the impurity is doped into the end portion 13a of the underlayer 13.

Next, as shown in FIG. 8C, on a side portion of the reference layer 23, the shift canceling layer 24, and the cap layer 25, a sidewall insulating film 26 is formed. More specifically, after depositing the insulating film 26 on the entire surface so as to cover the reference layer 23, the shift canceling layer 24, and the cap layer 25, etch-back is performed, thereby allowing the insulating film 26 to remain only at the side portion of the reference layer 23, the shift canceling layer 24, and the cap layer 25.

Next, as shown in FIG. 8D, by using the cap layer 25 and the sidewall insulating film 26 as a mask, the tunnel barrier layer 22, the storage layer 21, the underlayer 13, and the buffer layer 12 are selectively etched by the IBE method, etc. In this way, the MTJ element 20 constituted of the storage layer 21, the tunnel barrier layer 22, and the reference layer 23 is formed.

As can be seen, in the present embodiment, since an impurity is doped into only the end portion 13a of the underlayer 13 by ion implantation, the series resistance of the element as a whole can be reduced. Accordingly, an advantage similar to that of the first embodiment can be obtained.

Also, in the present embodiment, since the sidewall insulating film 26 is provided, even by general ion implantation performed in a perpendicular direction instead of ion implantation performed from an oblique direction, ion implantation can be carried out only at the end portion 13a of the underlayer 13. Accordingly, not only is this embodiment advantageous in terms of the process, but also in that the impurity can be doped into the end portion 13a of the underlayer 13 without being doped into the end portion of the shift canceling layer 24 or the reference layer 23.

Further, reducing the resistance of the end portion of the tunnel barrier layer 22 may cause an inconvenience such as a current path being produced at the end portion of the tunnel barrier layer 22. However, in the present embodiment, by adopting a sidewall insulating film structure, the end portion of the tunnel barrier layer 22 is not in contact with the reference layer 23. Accordingly, even if the resistance of the end portion of the tunnel barrier layer 22 is reduced, an inconvenience such as a current path being produced at the end portion of the tunnel barrier layer 22 is not caused.

(Modification)

Note that the embodiments are not limited to those described above.

Figure 9:
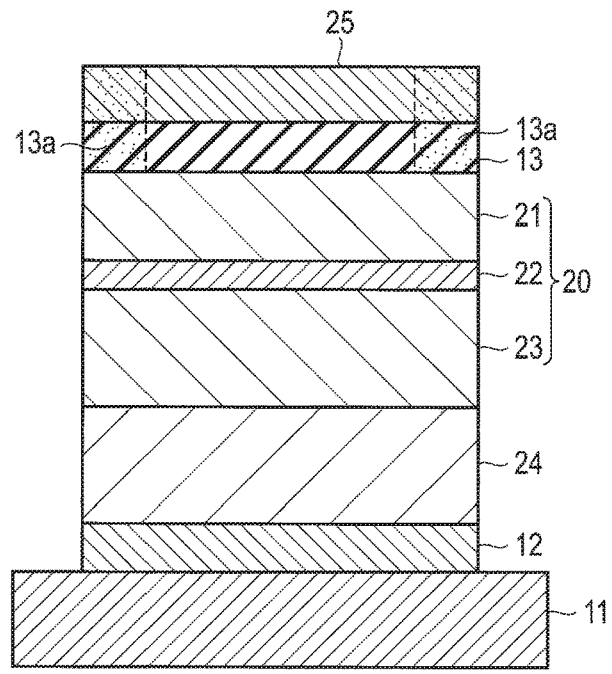
FIG. 9 is a cross-sectional view showing a structure of a memory cell portion of a magnetoresistive memory device of a modification.
Figure 10:
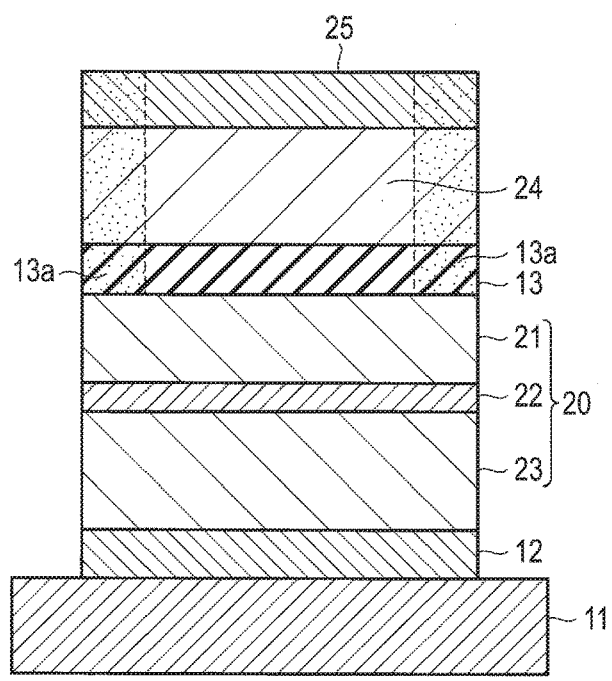
FIG. 10 is a cross-sectional view showing a structure of a memory cell portion of a magnetoresistive memory device of another modification.

In the embodiments, a structure in which the underlayer 13, the storage layer 21, the tunnel barrier layer 22, the reference layer 23, and the shift canceling layer 24 are stacked in this order from the side of the substrate has been described. However, the positional relationship of these elements can be changed as appropriate. FIGS. 9 and 10 show an example in which the storage layer 21 is disposed on the upper side and the reference layer 23 is disposed on the lower side.

In FIG. 9, the shift canceling layer 24, the reference layer 23, the tunnel barrier layer 22, the storage layer 21, the insulating layer 13, and the cap layer 25 are stacked in this order on the buffer layer 12. In FIG. 10, the reference layer 23, the tunnel barrier layer 22, the storage layer 21, the insulating layer 13, the shift canceling layer 24, and the cap layer 25 are stacked in this order on the buffer layer 12.

In either of these examples, by doping an impurity into the entirety of the insulating layer 13, an advantage similar to that of the first embodiment can be expected. Also, by doping the impurity into the end portion 13a of the insulating layer 13, an advantage similar to that of the second or third embodiment can be expected.

Moreover, the underlayer (insulating layer) is not limited to AlN, and can be any material as long as it can promote crystallization by aligning crystal plane orientation of a layer to be formed thereon (or a layer which comes into contact with the underlayer). More specifically, MgO or SiN can be used instead of AlN.

Also, the impurity to be doped into the insulating layer is not limited to Si, and an impurity of group II, group IV, or group VI can be used. More specifically, at least one element selected from the group consisting of Be, Mg, Ca, Sr, Ba, C, Si, Ge, Sn, S, Se, and Te can be used. A plurality of elements may be selected from the above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Here, when a group II element is added to a group III-V compound, since the group II element substitutes for a group III element, the group II element which has been added bonds to a group V element in a crystal. Further, when an outermost electron is shared, the number of electrons is reduced by one with respect to the 8 electrons that can be stably accommodated in the outermost shell, and one vacancy is produced. This represents a hole, and conductivity is increased.

When a group VI element is added to a group III-V compound, since the group VI element substitutes for a group V element, the group VI element bonds to a group III element. Further, when an outermost electron is shared, there will be a surplus of electron because the number of electrons is increased from 8 to 9. This surplus electron becomes a free electron, and conductivity is increased.

When a group IV element is added to a group III-V compound, if the group IV element substitutes for a group III element, the number of electrons in the outermost shell becomes 9 when the group IV element bonds to a group V element, meaning that there is an excess electron. This electron becomes a free electron, and contributes to electrical conduction. Furthermore, if the group IV element substitutes for the group V element, the number of electrons in the outermost shell becomes 7 when the group IV element bonds to the group V element, meaning that the outermost shell is short of an electron. This yields a hole, which contributes to electrical conduction.

In either case, an electron or a hole is produced, which contributes to electrical conduction. Accordingly, the electrical conductivity is increased, and an effect as parasitic resistance is reduced.

FIG. 11 is a characteristic diagram showing the relationship between the amount of impurity added to AlN and the resistance. The film thickness of AlN was set to 1 nm, and the resistance was verified while changing the amount of Mg and Si added. As a result, it was found that when Mg was added by 10 to 40 at %, and Si was added by 5 to 30 at %, the resistance was greatly reduced. Further, a similar tendency was found when the film thickness of AlN was within the range of 1 to 1.5 nm.

What is claimed is:
1. A magnetoresistive memory device comprising:
a magnetoresistive element of a stacked layer structure comprising a first magnetic layer, a second magnetic layer, and a nonmagnetic layer between the first and second magnetic layers; and
an insulating layer of a group III-V compound provided on a side of the first magnetic layer of the magnetoresistive element, the insulating layer including an additional element from one of group II, group IV, and group VI.

2. The device of claim 1, wherein:
   the first magnetic layer is a storage layer in which a magnetization direction is variable;
   the nonmagnetic layer is a tunnel barrier layer; and
   the second magnetic layer is a reference layer in which a magnetization direction is fixed.

3. The device of claim 2, further comprising a shift canceling layer which reduces a stray magnetic field caused by the reference layer, the shift canceling layer being provided on the reference layer, opposite to the storage layer.

4. The device of claim 1, further comprising a conductive buffer layer provided on the insulating layer, opposite to the first magnetic layer.

5. The device of claim 1, wherein the insulating layer includes the additional element at an end portion.

6. The device of claim 5, wherein an end portion of the second magnetic layer is located at a more interior side than the end portion of the insulating layer.

7. The device of claim 1, wherein the insulating layer is AlN, GaN, InN, MgO or SiN.

8. The device of claim 1, wherein the additional element is at least one element selected from the group consisting of Be, Mg, Ca, Sr, Ba, C, Si, Ge, Sn, S, Se, and Te.

9. The device of claim 1, further comprising a substrate provided with a select transistor, and an electrode connected to one of a source and a drain of the select transistor, on a side of the insulating layer of the magnetoresistive element, wherein
   the insulating layer is provided on the electrode, and the magnetoresistive element is provided on the insulating layer.

\* \* \* \* \*